United States Patent [19]
Brown et al.

[11] Patent Number: 5,314,539
[45] Date of Patent: May 24, 1994

[54] APPARATUS FOR PLASMA TREATMENT OF CONTINUOUS MATERIAL

[75] Inventors: Robert W. Brown, Ivanhoe; Ian H. Coopes, Camberwell; Joseph Fusca, Macleod West; Kenneth J. Gifkins, Victoria; John A. Irvin, Applecross, all of Australia

[73] Assignee: Eastman Kodak Company, Rochester, N.Y.

[21] Appl. No.: 946,490

[22] PCT Filed: May 9, 1991

[86] PCT No.: PCT/US91/03229
§ 371 Date: Nov. 2, 1992
§ 102(e) Date: Nov. 2, 1992

[87] PCT Pub. No.: WO91/17561
PCT Pub. Date: Nov. 14, 1991

[30] Foreign Application Priority Data
May 10, 1990 [AU] Australia ................. 90/0066
Oct. 19, 1990 [AU] Australia ................. 90/2831

[51] Int. Cl.$^5$ .................. C23C 16/50; C23C 16/54
[52] U.S. Cl. .................. 118/718; 118/719; 118/723 E; 118/730; 118/733
[58] Field of Search ........... 118/715, 718, 719, 723 E, 118/730, 733

[56] References Cited

U.S. PATENT DOCUMENTS

| | | | |
|---|---|---|---|
| 3,057,795 | 10/1962 | Frohlich | 204/312 |
| 3,179,482 | 4/1965 | Kassenbeck | 8/2 |
| 3,205,086 | 9/1965 | Brick et al. | 117/4 |
| 3,246,365 | 4/1966 | Kloender | 18/10 |
| 3,288,638 | 11/1966 | van Paassen et al. | 117/213 |
| 3,334,908 | 8/1967 | Starbuck | 277/237 |
| 3,384,900 | 5/1968 | Buschmann | |
| 3,475,307 | 10/1969 | Knox et al. | 204/168 |
| 3,502,499 | 3/1970 | Coad | 117/101 |
| 3,526,583 | 9/1970 | Hayward | 204/165 |
| 3,761,299 | 9/1973 | Lidel | 117/34 |

(List continued on next page.)

FOREIGN PATENT DOCUMENTS

0337369A1 10/1989 European Pat. Off.
1579002 11/1980 United Kingdom.
2080611 2/1982 United Kingdom.

OTHER PUBLICATIONS

H. Yasuda, Journal of Micro Molecular Scientific Chemistry A10, 383, 1976.

Primary Examiner—Brian E. Hearn
Assistant Examiner—Jonathan D. Baskin
Attorney, Agent, or Firm—Carl F. Ruoff

[57] ABSTRACT

An apparatus (1) for continuous treatment of a material (M) of continuous length with a low temperature plasma of a plasma gas (G) under vacuum. The apparatus (1) includes a plasma treatment chamber (3) having a chamber wall (4) and, in the wall (4), an entrance zone (6) and an exit zone (7) for receiving and discharging the continuous material (M). Evacuating means (48) is operable to establish a vacuum in the chamber (3). Support means (9) advances the continuous material (M) along a path (8) through the chamber (3) and also maintains a vacuum seal at the entrance and exit zones (6,7). The support means (9) includes a backing roller (10) mounted adjacent the entrance and exit zones (6,7), an entrance sealing roller (11) positioned adjacent the entrance zone (6) and an exit sealing roller (13) positioned adjacent the exit zone (7). The backing roller (10) forms with each sealing roller (11,13) a respective nip (12,14) at the entrance and exit zones (6,7) through which the continuous material (M) passes into and out of the treatment chamber (3). A plasma generating head (53) is positioned within the treatment chamber (3) adjacent the path (8) for generating a low temperature plasma which contacts the continuous material (M) while it is advanced through the treatment chamber (3).

27 Claims, 4 Drawing Sheets

U.S. PATENT DOCUMENTS

| | | | |
|---|---|---|---|
| 3,837,866 | 9/1974 | Malmendier et al. | 106/47 |
| 3,867,768 | 2/1975 | Jamin | 34/242 |
| 3,870,610 | 3/1975 | Baird et al. | 204/165 |
| 3,944,709 | 3/1976 | Levy | 428/409 |
| 3,952,568 | 4/1976 | Wareing et al. | 72/38 |
| 4,026,787 | 5/1977 | Kuehnle | 204/298 |
| 4,048,953 | 9/1977 | Froberg | 118/49 |
| 4,065,137 | 12/1977 | Rueggeberg et al. | 277/34 |
| 4,072,769 | 2/1978 | Lidel | 427/38 |
| 4,179,820 | 12/1979 | Steffensen et al. | 34/92 |
| 4,437,324 | 3/1984 | Sando et al. | 68/5 E |
| 4,451,497 | 5/1984 | Dolezalek et al. | 427/39 |
| 4,457,145 | 7/1984 | Ohba | 72/234 |
| 4,551,310 | 11/1985 | Imada et al. | 422/186.05 |
| 4,655,167 | 4/1987 | Nakamura et al. | 118/719 X |
| 4,763,601 | 8/1988 | Saida et al. | 118/723 X |
| 5,000,114 | 3/1991 | Yanagi et al. | 118/718 X |
| 5,016,561 | 5/1991 | Tokai et al. | 118/718 |
| 5,192,585 | 3/1993 | Inokuti et al. | 118/718 X |

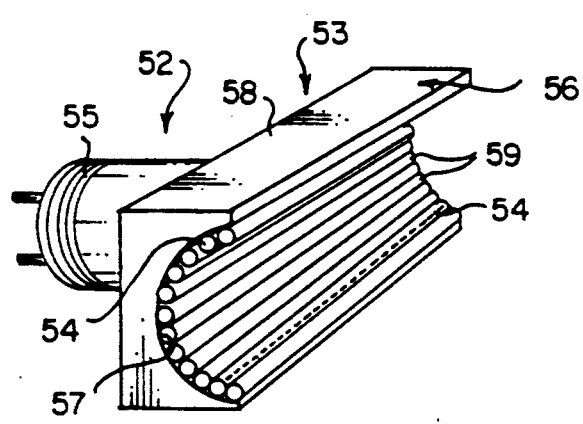
FIG. 2
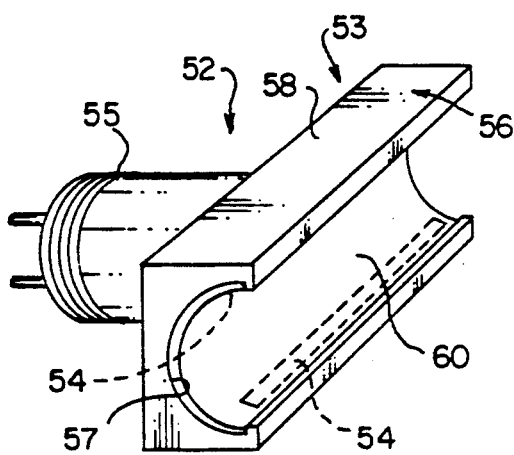
FIG. 3
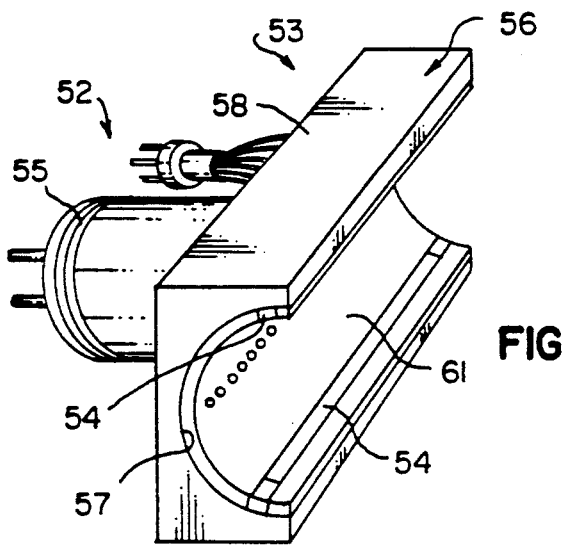
FIG. 4
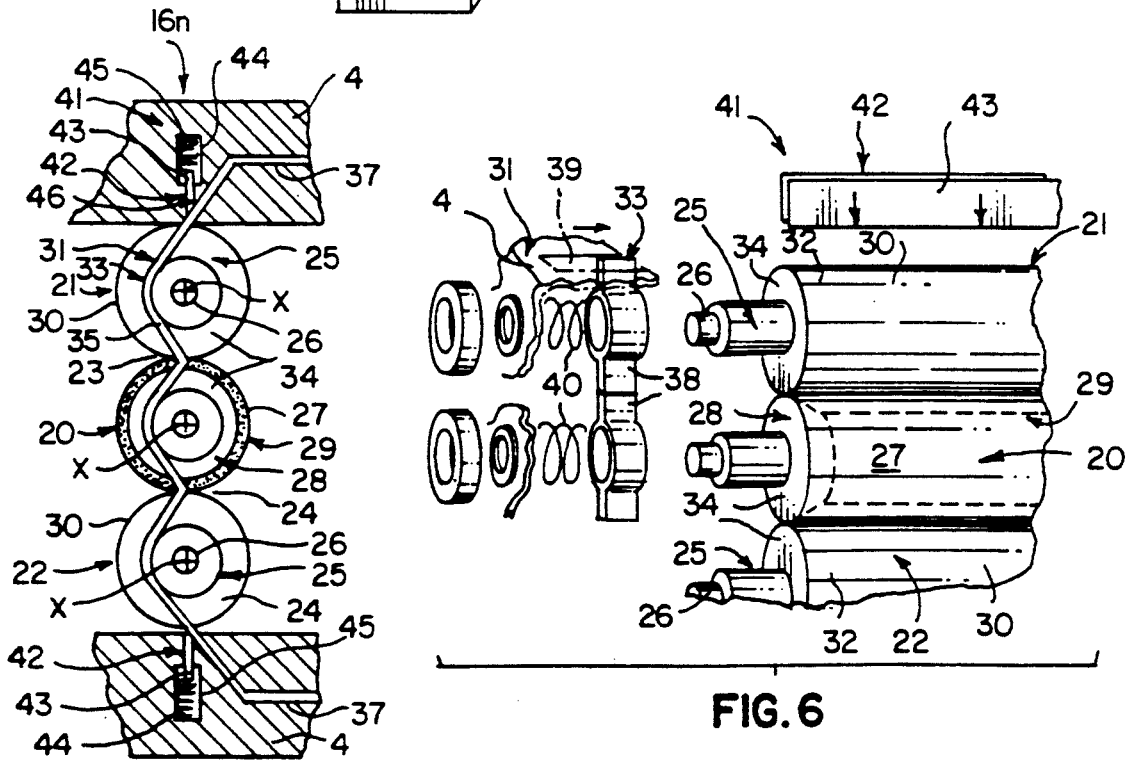
FIG. 5
FIG. 6

APPARATUS FOR PLASMA TREATMENT OF CONTINUOUS MATERIAL

BACKGROUND OF THE INVENTION

1. Field of the Invention

This invention relates generally to plasma treatment of material, and in particular to an apparatus for continuous treatment of continuous material with a plasma of a plasma gas under vacuum. The invention is applicable to the treatment of photographic support material, whereby transient surface modifications induced by plasma treatment are exploited to enable improved adhesion and coatability of photographic emulsions to the support. The support is particularly a polyethylene coated paper photographic support. It will be convenient to hereinafter describe the invention in relation to this exemplary application, although it is to be appreciated that the invention is not limited to that application.

2. Description of the Related Art

Plasma or glow discharge treatment of material surfaces has been reported in numerous publications including J. R. Hollahan and A. T. Bell, "Techniques and Applications of Plasma Chemistry", Wiley, N.Y. 1974 and H. Yasuda, J. Macromol. Sci. Chem. A10,383 (1976). Such treatment has also been the subject of a variety of patents including U.S. Pat. Nos. 3,057,795, 3,288,638, 3,475,307, 3,526,583, 3,761,299, 3,837,886, 3,944,709, 4,437,324, 4,451,497, 4,457,145 and 4,551,310, and British Patents 997093 and 1579002.

The discharges occuring during treatment may be struck in most gases using voltages from several hundred volts to several kilovolts. Pressures are usually in the range 1.33 to 1333.22 pascal (0.01 to 10 Torr) and discharge frequencies range from DC to 100 MHz. In most cases of interest here, the treatment affects the surface properties of materials by modifying the chemical nature of the surface layer. Plasma treatment may be used to improve the bonding of coatings such as adhesives, dyes, inks, polymers and photographic emulsions, to improve the wettability of hydrophobic materials or to alter mechanical properties such as the coefficient of friction or the cohesiveness of textile fibres. In another variation, thin polymer films may be deposited on most surfaces by plasma polyermization from a discharge in an appropriate gaseous monomer. Apart from their potential use as bonding layers, such thin films find other possible uses including protective and decorative layers, optical coatings, capacitor dielectrics and semipermeable membranes.

Few of the reported applications of plasma treatment have utilized any short-lived properties (lasting for up to several hours) of the treated surfaces in subsequent processes. It has been shown, for example in British patent 997093, that surface radicals are produced by plasma treatment of a wide range of organic materials and can be used to initiate graft polymerization if the treated surface is exposed to monomer vapor a short time after treatment. Studies have also shown that surface hydrocarbon radicals are rapidly destroyed in most cases by exposure to oxygen but allylic, polyenyl and peroxy radicals which can be formed in this process may survive for time periods longer than several minutes. The prior art literature does not appear to contain any reference to the possibility of using such short-lived species to react with coatings or films which are rapidly applied to a treated surface. These applications would appear to be of a different nature than those of graft polymerization in that radicals are not used to initiate polymerization but are merely allowed to react with molecules brought adjacent to the surface.

In the photographic industry, the wetting and adhesive properties of hydrophobic (unsubbed) photographic support such as polyethylene coated paper has traditionally been improved prior to coating by subjecting the support to Corona Discharge Treatment. The corona can be formed in air at atmospheric pressure by subjecting an electrode above a dielectric covered roller to a high voltage (15 KV peak) low frequency (10 KHz) signal.

As well as improving the wetting by, and the adhesion to, aqueous photographic emulsion layers, corona discharge treatment introduces strongly bound polar charge into the surface of the support. This charge can disturb the liquid emulsion at the point of application to create non-uniformities in the coated layer. To reduce the severity of this, discharge equipment is included between the corona treater and the coating station. Conventional electrostatic dischargers, such as stressed wire corona dischargers, multiple point corona bars, air jet ionizers and radio-active dischargers are not wholly effective because the polar charge produces a very small external field and the number of ions produced per unit time is insufficient to meet the demand. As will be shown later, plasma treatment can in fact remove non-uniform polar charge.

The deposition of a uniform layer of polar charge on photographic support is of importance in high speed coating applications. The polar charge attracts the coating bead which would not otherwise wet the support at high coating speeds, thereby eliminating skottle (air entrainment which disturbs coating uniformity). Polar charge layers with potentials up to 3000 V have been deposited by V-channel ionizers or polar charge brushes. These devices essentially create a corona discharge above the web surface and simultaneously transport charge to the surface of the web. The achievement of controlled uniform levels of polar charge requires a considerable level of complexity in these devices. As will be shown later, a uniform polar charge layer may be deposited in a similar but simpler fashion from a glow discharge during plasma treatment of a photographic support.

Most of the applications of plasma treatment disclosed in the above patents utilize a batch process. That is, the material to be treated is placed inside a vacuum chamber which is then evacuated and the treatment carried out. However, where continuous webs or filaments are to be treated it may be more cost effective to transport the material through a vacuum seal into the treatment zone and back out again in a continuous manner. This possibility is addressed in a number of patents. In that regard, moving filaments or rods can generally be sealed in a satisfactory manner using slot seals as disclosed in U.S. Pat. Nos. 3,502,499 and 3,952,568, and British patent 1238450. Moving webs can be sealed by slot seals as discussed in U.S. Pat. Nos. 3,057,795, 3,179,482, 3,761,299, 4,026,787 and 4,072,769, liquid seals as discussed in U.S. Pat. No. 3,870,610, press seals as discussed in U.S. Pat. Nos. 3,384,900, 3,867,768 and 4,065,137, roller seals as discussed in U.S. Pat. Nos. 3,205,086, 3,246,365, 3,384,900, 3,867,768, 4,048,953, 4,065,137, 4,179,820 and 3,334,908, and belt seals as discussed in U.S. Pat. No. 4,048,953.

Slot seals, liquid seals and press seals have all been utilized in apparatus involving plasma treatment of webs.

However, slot seals are unsatisfactory due to their high leak rates and hence large pumping capacity requirements. Web flutter can also be a problem and may cause web damage. Liquid seals are cumbersome and may produce undesirable contamination of many substrates.

Press seals can provide good vacuum sealing but could cause frictional damage to web surfaces. Webs of high tensile strength are also required to pass satisfactorily through press seals so that they are not suitable for the present exemplary application.

Roller seals have been used in various apparatuses for transport of webs or sheets into and out of a vacuum, although they have not been used for plasma treatment applications. Generally, the roller seals have incorporated non-compliant rollers and have been used to transport webs of high tensile strength (e.g. metal strips and wood veneer) or deformable webs (woven fabrics). Non-compliant rollers allow leakage of air in the gaps defined between the edges of the web and the edges of the rollers. Furthermore, they do not readily allow control of the pressure exerted by the rollers on the web. Control of the roller to web pressure is critical for the avoidance of steering and creasing problems when transporting more fragile webs, such as photographic supports. U.S. Pat. No. 3,334,908 describes apparatus incorporating compliant roller seals for sealing about high tensile strength webs or sheets. However, in that patent a non-compliant backing roller engages with the compliant sealing rollers to define nips, and a series of non-compliant wiper rollers back onto the sealing rollers to seal off leakage that may occur because of the necessary clearance between the sealing rollers and their housing. These multiple wiper rollers again make it difficult to control the sealing roller to web. In addition, lack of appropriate adjustment in the wiper rollers does not permit the maintenance of minimal nip pressure to be applied to the transported web.

U.S. Pat. No. 4,048,953 describes a continuous belt seal for transport of fragile webs (papers) through a vacuum system, although again, not for plasma treatment applications. This apparatus is relatively complex and operates at a maximum web speed of 18 meters per minute, which is much slower than current coating speeds of most photographic products.

In European Patent Application 0,337,369, a continuous vacuum deposition apparatus is described that includes seal devices made of a set of three pinch rolls. The three pinch rolls are arranged in parallel on one plane and a pair of seal bars are positioned on said parallel plane to form one end of the vacuum chamber. For each successive vacuum chamber a set of three pinch rolls is required. In the present invention each successive chamber requires only one additional roll.

French Patent Application 2,485,319 shows a typical vacuum sealing system for treatment of a web with low temperature plasma wherein each sealing chamber is provided with a pair of nip rolls. The present invention reduces the number of rolls required for each sealing chamber.

Finally, in French Patent Application 2,487,696 a vacuum treatment apparatus is described which continuously treats the surface of a plastic molding under vacuum. Each auxiliary vacuum chamber includes a pair of seal rolls. The present invention reduces the amount of seal rolls required for each vacuum chamber.

SUMMARY OF THE INVENTION

It is an object of the present invention to provide an improved apparatus for continuous treatment of a material of continuous length with a plasma.

A further object is to provide an apparatus for transporting fragile continuous material, such as photographic support, into and out of a region of low pressure in a continuous manner at high speeds.

A further object of the present invention is to provide an apparatus operable to apply an RF or DC plasma treatment in air to polyethylene coated paper photographic support in order to provide alternate adhesion mechanisms and to increase the rate of adhesion of photographic emulsions to the photographic support.

Another object of the present invention is to provide an apparatus that removes non-uniform polar charge from the surface of material, such as photographic support, and to effect deposition from a plasma of a uniform polar charge layer on the surface.

With these objects in mind, the present invention broadly provides an apparatus for continuous treatment of a material of continuous length with a low temperature plasma of a plasma gas under vacuum, the apparatus including: a plasma treatment chamber having a chamber wall and, in the wall, an entrance zone and an exit zone for receiving and discharging the continuous material, respectively; evacuating means operable to establish a vacuum in the chamber; support means for advancing the continuous material along a path through the chamber and also for maintaining a vacuum seal at the entrance and exit zones while the continuous material passes therethrough, the support means including a backing roller mounted adjacent the entrance and exit zones for rotation on an axis thereof, an entrance sealing roller positioned adjacent the entrance zone and an exit sealing roller positioned adjacent the entrance zone, the sealing rollers being mounted for rotation on a respective axis thereof, the backing roller forming with each sealing roller a respective nip at the entrance and exit zones through which the continuous material passes into and out of the treatment chamber, respectively; and plasma generating means positioned within the treatment chamber adjacent the path for generating a low temperature plasma which contacts the continuous material while it is advanced through the treatment chamber.

Treatment chamber is preferably sub-divided into sub-chambers providing sequential vacuum stages between the entrance and exit zones. The vacuum varys between adjacent stages. The plasma generating means is positioned within one of the sub-chambers providing a plasma treatment vacuum stage.

The vacuum stages preferably include at least one pre-treatment vacuum stage between the entrance zone and the plasma treatment vacuum stage. Preferably, at least one post-treatment vacuum stage is provided between the plasma treatment vacuum stage and the exit zone.

In one preferred arrangement, each vacuum stage is provided by a separate sub-chamber. With this arrangement the path makes a single pass through each sub-chamber between the entrance and exit zones.

In another preferred arrangement, each one pre-treatment vacuum stage and each one post-treatment vacuum stage are provided in common by a respective sub-chamber. With this arrangement the path makes a double pass through each sub-chamber between the entrance and exit zones.

The treatment chamber preferably has at least one vacuum stage transition zone spaced apart from the entrance and exit zones. The vacuum stages are defined between these zones. The support means preferably advances the continuous material along the path through each vacuum stage and also providing vacuum sealing at each transition zone.

Where the vacuum stages are provided by separate sub-chambers, the support means preferably includes a further rotatable sealing roller at each transition zone. Each further sealing roller forms with the backing roller a nip through which the continuous material passes for advancement between adjacent vacuum stages. Alternatively, where the vacuum stages are provided in common by the sub-chambers, then the support means preferably includes a further rotatable backing roller and a pair of further rotatable sealing rollers at each transition zone. Each further backing roller forms with each further sealing roller a respective nip through which the continuous material passes in opposite directions between adjacent vacuum stages.

Drive means is preferably connected to at least one of the rollers for driving rotation thereof.

At least one roller at each nip preferably has a compliant outer circumferential surface in order to improve sealing between the rollers and continuous material. Preferably, each backing roller has a compliant outer circumferential surface.

The support means preferably further includes end sealing means engaging ends of each roller and the chamber wall so as to vacuum seal therebetween and also between adjacent rollers. This end sealing means preferably includes elongate end sealing elements mounted between the roller ends and chamber wall. These sealing elements extend across and/or about roller end surfaces so as to be in sealing engagement with the roller end surfaces and chamber wall. The effect of this arrangement is that the sealing elements define uninterrupted sealing lines at the roller ends at each of the zones.

Preferably, face sealing means is provided for vacuum sealing between the outer circumferential surface of the sealing rollers and the chamber wall. The face sealing means preferably includes elongate face sealing elements mounted between the outer surface of each sealing roller and the chamber wall. These sealing elements extend entirely along the outer circumferential surface of the sealing rollers so as to be in sealing engagement with the outer surfaces and chamber wall. In this way uninterrupted sealing lines are defined by the sealing elements along the sealing rollers.

The plasma generating means preferably includes at least one plasma generating head. The head is preferably located so as to treat an outer surface of the continuous material.

In one preferred embodiment, the continuous material passes about the backing roller adjacent the entrance and exit zones during advancement through the plasma treatment chamber. In an alternative arrangement, the support means further includes an additional backing roller about which the continuous material passes during advancement through the plasma treatment chamber. In these arrangements, the plasma generating head is preferably located adjacent and outwardly of the backing rollers. Thus, the treatment head is operable to treat the continuous material outer surface as it passes about the backing rollers.

The plasma generating head preferably includes an array of plasma generating electrodes. Those electrodes are preferably arranged in a spaced apart, arcuate array so as to extend in an arc parallel with the path about the outer circumferential surface of that backing roller at which the continuous material is treated. Each electrode is preferably elongate and of a length at least equal to the width of the continuous material to be treated. The plasma generating head preferably also includes a shield member for concentrating the plasma from the electrodes toward the path of the continuous material and minimising stray plasma discharge away from that path.

In one arrangement, the backing roller at which the continuous material is treated incorporates an electrode to which an RF charge is applied for orienting the electric field relative to the continuous material. In another arrangement, that backing roller incorporates an electrode to which a DC bias is applied so as to deposit a uniform polar charge on a surface of the continuous material during plasma treatment.

BRIEF DESCRIPTION OF THE DRAWINGS

The following description refers to preferred embodiment of the apparatus of the present invention. To facilitate an understanding of the invention, reference is made in the description to the accompanying drawings where the apparatus is illustrated. It is to be understood that the invention is not limited to the embodiments as hereinafter described and as illustrated.

In the drawings, where the same reference numerals identify the same or like components:

FIG. 2 is a perspective view of a plasma generating head suitable for incorporation in the apparatus of FIG. 1;

FIG. 3 is a perspective view of an alternative plasma generating head suitable for incorporation in the apparatus of FIG. 1;

FIG. 4 is a perspective view of yet another plasma generating head suitable for incorporation in the apparatus of FIG. 1;

FIG. 5 is a schematic side view of part of the apparatus of FIG. 1 showing end and face sealing means for the rollers thereof;

FIG. 6 is a schematic perspective view (partially exploded) of part of the apparatus of FIG. 1 showing alternative end and face sealing means for the rollers thereof;

DESCRIPTION OF THE PREFERRED EMBODIMENTS

Figure 1:
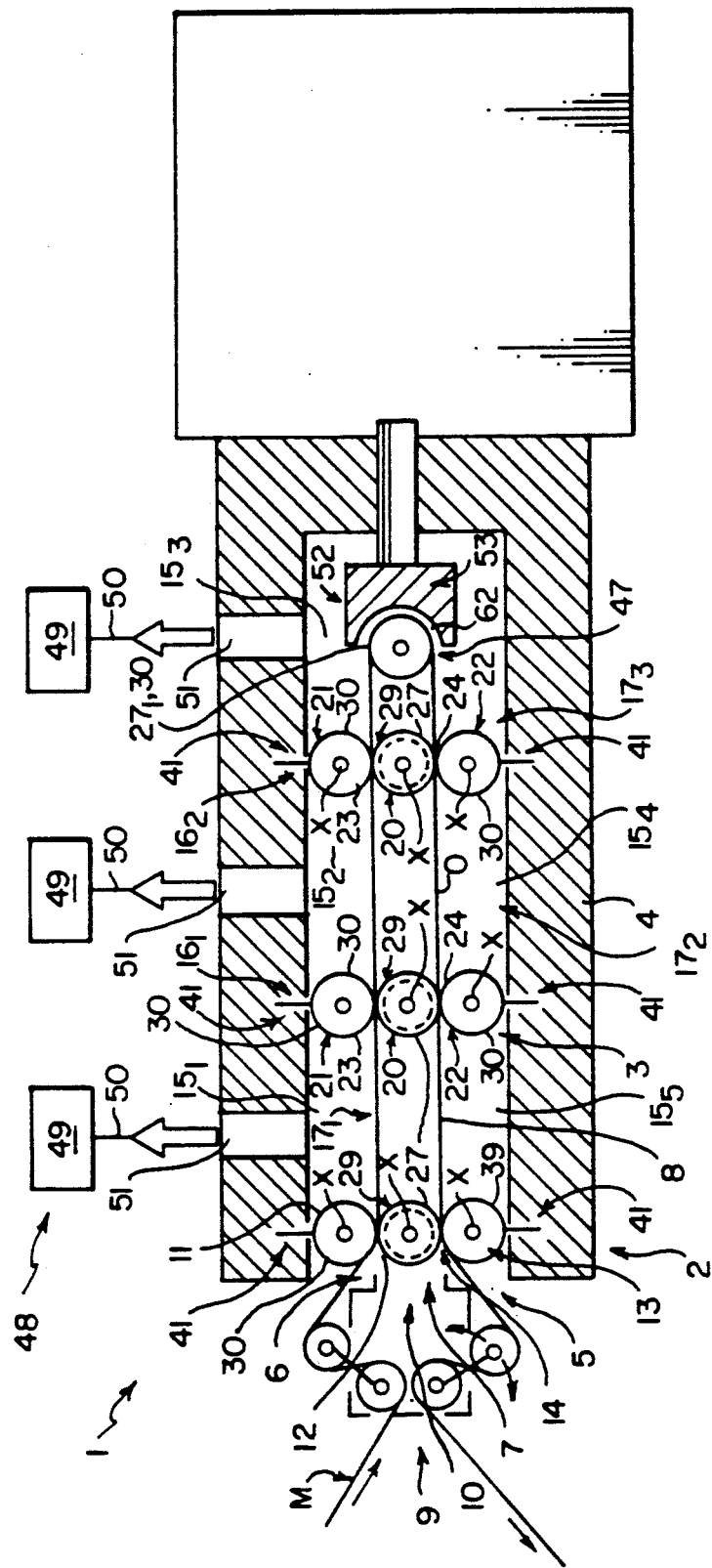
FIG. 1 is a schematic side view of one embodiment of plasma treatment apparatus incorporating the present invention.
Figure 7:
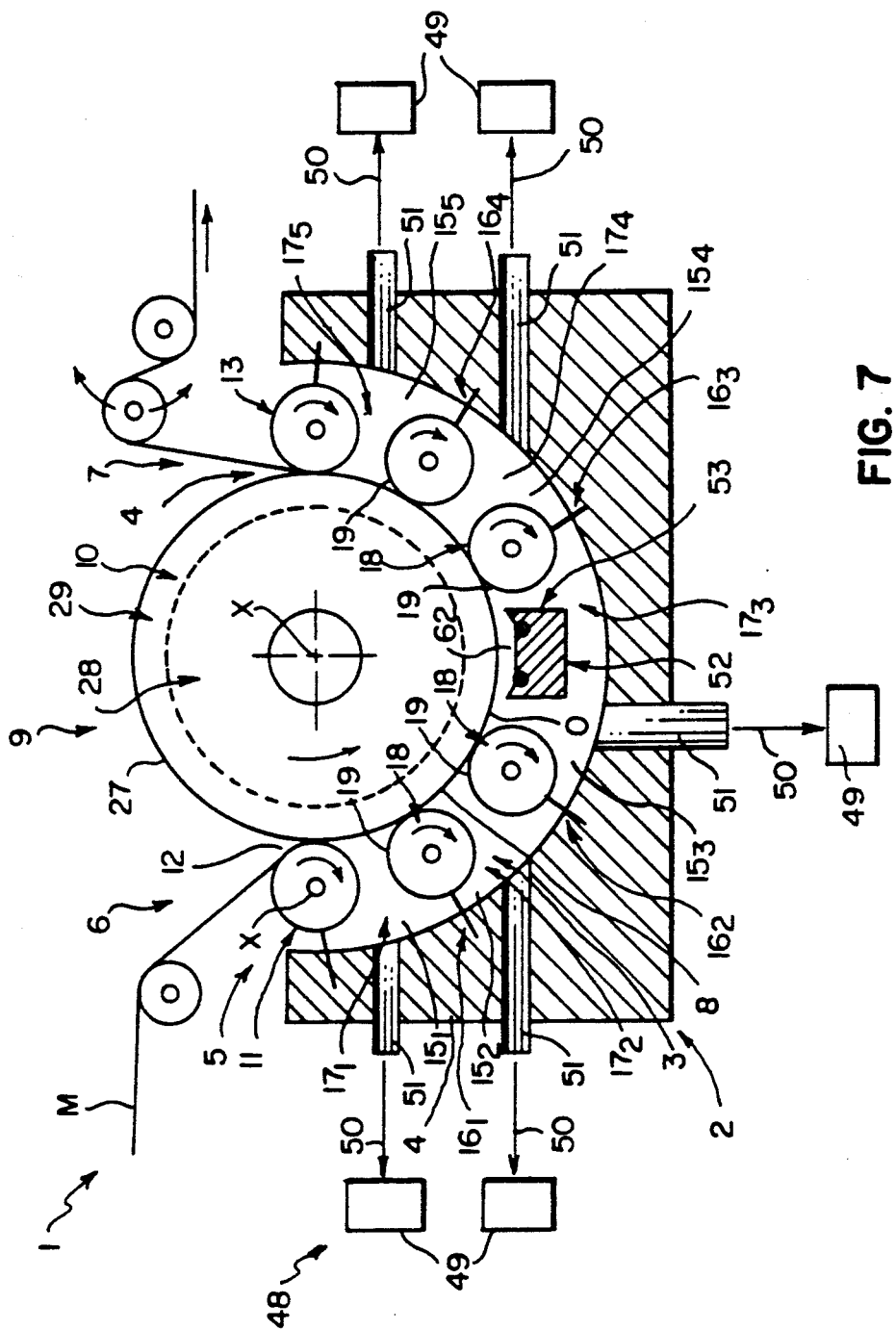
FIG. 7 is a schematic side view of another embodiment of plasma treatment apparatus incorporating the present invention.
Figure 9:
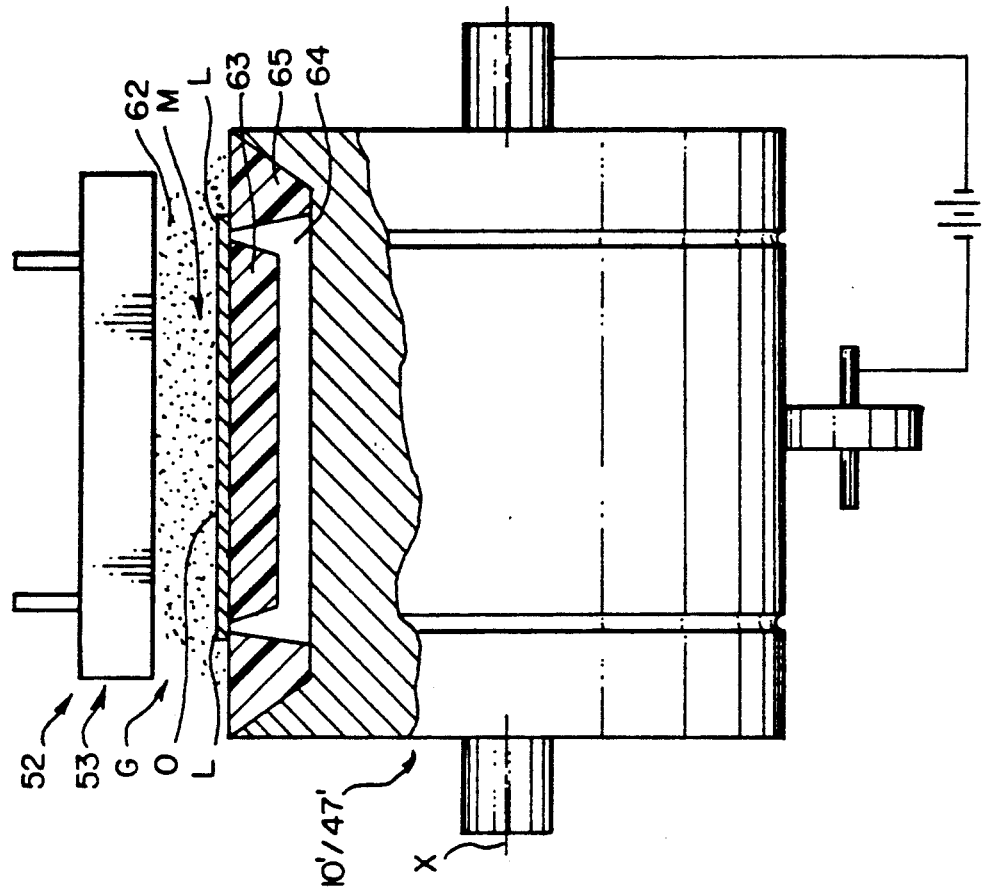

Referring initially to FIGS. 1 and 7 there is generally shown alternative embodiments of apparatus 1 for treatment of continuous material M with a plasma of a plasma gas G. Apparatus 1 includes a housing 2 providing a plasma treatment chamber 3. This chamber 3 is defined by a chamber wall 4 of housing 2.

Within chamber wall 4 there is provided an enlarged opening 5 providing entrance zone 6 through which the material M passes into the chamber 3. An exit zone 7 is also provided by this opening 5 through which the material M passes out of the chamber 3.

The continuous material M is advanced through the chamber 3 along path 8, and is supported during that advancement by support means 9. In these embodiment, opening 5 is sealingly closed other than for the passage of the material M through the entrance and exit zones 6,7, and that closure is achieved by the support means 9.

Support means 9 includes a backing roller 10 mounted at the opening 5 adjacent the entrance and exit zones 6,7, for rotation on axis X.

Support means 9 also includes an entrance sealing roller 11 mounted at the entrance zone 6, for rotation on axis X (parallel to the axis X of the backing roller 10). The backing roller 10 and entrance sealing roller 11 together form a nip 12 at the entrance zone 6 through which the material M passes into the treatment chamber 3.

Similarly, support means 9 further includes an exit sealing roller 13 mounted at the exit zone 7, for rotation on axis X (parallel to the axes X of rollers 10,11). The backing roller 10 and exit sealing roller 13 together form a nip 14 at the exit zone 7 through which the material M passes out of the treatment chamber 3.

Apparatus 1 is operated in these embodiments with a vacuum in the treatment chamber 3. In these embodiments, there is a staged vacuum in the chamber 3 so that the chamber 3 is sub-divided into sequential vacuum stages $15_n$ (where n is stage numbers) between the entrance and exit zones 6,7, the vacuum varying between adjacent stages $15_n$. To that end, the treatment chamber 3 has one or more vacuum stage transition zones $16_n$ (where n is the zone number) spaced apart between the entrance and exit zones 6,7, and between which respective vacuum stages 15 n are defined. This staged vacuum provides significant savings in the capacity of the equipment used in evacuating chamber 3, the extent of those savings depending on the end vacuum required. In those embodiments, at least three vacuum stages $15_{1-3}$ are provided, although five stages $15_{1-5}$ (as shown) or even more stages (not shown) are also envisaged.

In these embodiments, the vacuum pressure at which the plasma treatment occurs is of the order of less than about 1 Torr, and may be from about 0.5 Torr to about 0.8 Torr. One vacuum stage $15_3$ (the plasma treatment stage) is evacuated to this pressure during apparatus use, in this embodiment. Stage(s) $15_{1-2}$ from the entrance zone 6 to the plasma treatment stage $15_3$ is/are progressively evacuated from ambient environment pressure to that plasma treatment pressure whilst the stage(s) $15_{4-5}$ from the plasma treatment stage $15_3$ to the exit zone 7 is/are progressively evacuated from the treatment pressure to the environment pressure. Thus, by way of example, in an apparatus (not shown) with three stage vacuum, the stages may be sequentially evacuated from 760 Torr (atmospheric-pressure) to about 50 Torr (pretreatment stage) to about 0.8 Torr (plasma treatment stage) and then back to about 50 Torr (post-treatment stage). In the same environment, an apparatus 1 (as shown in FIGS. 1 and 7) with a five stage vacuum, the stages may be sequentially evacuated to about 24.00 kilopascal (180 Torr) (first pretreatment stage $15_1$), to about 2.67 kilopascal (20 Torr) (second pretreatment stage $15_2$) to about 0.8 Torr (plasma treatment stage $15_3$) to about 20 Torr (first post-treatment stage $15_4$) and then to about 180 Torr (second post-treatment stage $15_5$).

In the embodiment of the apparatus 1 as shown in FIG. 7, the pre- and post- treatment vacuum stages $15_n$ are each separate so that the treatment chamber 3 is divided into sub-chambers $17_n$ (where n is sub-chamber number) each of which provides a respective vacuum stage $15_n$. That is, in a five stage vacuum chamber 3 (as shown), the chamber 3 is divided into five sub-chambers $17_{1-5}$ providing the pretreatment stages $15_{1-2}$, the treatment stage $15_3$ and the post-treatment stages $15_{4-5}$, respectively. In this embodiment, the path 8 makes a single pass through the chamber 3.

However, in an alternative embodiment of the apparatus as shown in FIG. 1, each pretreatment vacuum stage $15_{1-2}$ is in common with a respective post-treatment vacuum stage $15_{4-5}$. Thus, in a five stage vacuum chamber 3 (as shown), the chamber 3 is divided into three sub-chambers $17_{1-3}$ providing respectively a first pretreatment and second post-treatment stage $15_2$, $15_4$, a second pretreatment and first post-treatment stage, and the plasma treatment stage $15_3$. In this embodiment, the path 8 through the chamber 3 is folded so, as to be able to re-enter and pass through the common vacuum stages $15_1$, $15_2$, $15_4$, $15_5$.

In these embodiments, the support means 9 advances the continuous material M along the path 8 through each vacuum stage $15_n$ and also provides vacuum sealing at each transition zone $16_n$ between adjacent stages $15_n$, i.e. interstage sealing.

In the apparatus 1 (as shown in FIG. 7) having separate vacuum stages $15_{1-5}$, the support means 9 includes at each interstage transition zone $16_n$ a further sealing roller 18 mounted for rotation on an axis X, and forming with the backing roller 10 a nip 19 at the respective interstage transition zone $16_n$ through which the continuous material M passes for advancement between adjacent vacuum stages $15_n$. Thus, the backing roller 10 is common in forming each nip 19 with a respective sealing roller 18, the sealing rollers 18 being spaced apart about the backing roller 10 so as to define the vacuum stages $15_n$ therebetween.

It will be appreciated that the number of further sealing rollers 18 will depend on the number of vacuum stages $15_n$ required. Thus, for example, five vacuum stages $15_{1-5}$ (as shown) with four transition zones $16_{1-4}$ will require four further sealing rollers 18.

In the apparatus embodiment (as shown in FIG. 1) having common vacuum stages $15_{1-5}$, the support means 9 includes at each interstage transition zone $16_n$ a further backing roller 20 mounted for rotation on an axis X, and a pair of further sealing rollers 21,22 each mounted for rotation on a respective axis X. The further backing roller 20 forms with each further sealing roller 21,22 a respective nip 23,24 at an interstage transition zone $16_n$ through which the continuous material M passes in opposite directions between adjacent vacuum stages $15_n$. Thus, a separate backing roller 20 and a pair of sealing rollers 21,22 are positioned at each transition zone $16_n$ and provide a pair of nips 23,24, the continuous material M passing through one nip 23 during advance to the plasma treatment stage $15_3$ and passing through the other nip 24 during advance from that treatment stage $15_3$.

It will again be appreciated that the number of further backing rollers 20 and sealing rollers 21,22 will depend on the number of vacuum stages $15_n$ required. Thus, for example, five vacuum stages $15_{1-5}$ (as shown) with two transition zones $16_{1-2}$ will require two further backing rollers 20 each with one pair of cooperating sealing rollers 21,22.

In these embodiments, each sealing roller 11,13,18,21,22 is mounted for adjustment in order to vary pressure applied to the continuous material at the nips 12,14,19,23,24. In general, the nip pressure is at a minimum that will ensure material M movement through the treatment chamber 3 and maintain vacuum seals at the nips 12,14,19,23,14. Minimizing the nip pressure permits satisfactory steering of the material M through the nips 12,14,19,23,24.

In these embodiments, the apparatus 1 includes adjustable bearing mounts (not shown) through which the sealing rollers 11,13,18,21,22 are adjustably mounted. Each sealing roller 11,13,18,21,22 is carried by a respective support shaft 25, each end 26 of which is journalled in a respective bearing mount. The bearing mounts, having an axis offset from that of the rollers 11,13,18,21,22, are linearly adjustable in order to move the respective sealing rollers 11,13,18,21,22 toward and away from the backing rollers 10,20.

The rollers 10,11,13,18,20,21,22 are of a length at least equal to the width of continuous material M being treated. In these embodiments, those rollers 10,11,13,18,20,21,22 are longer than the material width in order to properly support the material M at the longitudinal edges L thereof. The continuous material M may be of any selected width and, in the exemplary application, it is envisaged that material up to about 1.5 meters wide may treated using the apparatus 1 of the present invention.

Speed of movement of the continuous material M through the treatment chamber 3 is controlled to meet the needs of the production machine as a whole. Treatment power is slaved to the speed of movement to provide constant treatment energy at the web surface. In the exemplary application, the treatment speed of the treatment apparatus 1 is dictated by the photographic coating machine and may be variable. The speed may be controlled in a range up to about 600 meters per minute, although in the exemplary application typical operating speeds will be between about 10 and 170 meters per minute.

In these embodiments, one or more of the rollers 10,11,13,18,20,21,22 are rotatably driven. All of the sealing rollers 11,13,18,21,22 may be synchronously driven by drive means (not shown), such as synchronous drive motors or torque drives in order to reduce frictional loading at the material surface and thereby reduce abrasion of the material surface by the rollers 10,11,13,18,20,21,22. The motors are directly or indirectly connected to the rollers 11,13,18,21,22 through the support shafts 25 carrying them.

In these embodiments, at least one roller 10,11,13,18,20,21,22 at each nip 12,14,19,23,24 has a compliant outer surface 27 in order to improve sealing between the rollers 10,11,13,18,20,21,22 and continuous material M, particularly at the longitudinal edges L of the material M. That compliant outer surface 27 also facilitates simple control of the pressure to be applied to the continuous material M to avoid material steering and creasing problems, as will become more apparent hereinafter.

In these embodiments, each backing roller 10,20 has a compliant outer surface 27. To that end, each backing roller 10,20 may comprise a core 28 composed of non-compliant material, for example metal such as steel, and an outer sleeve 29 composed of compliant material, for example rubber, to provide the compliant outer surface 27.

In these embodiments, each compliant outer surface 27 is polished in an effort to further reduce grip on the continuous material M and hence avoid material steering and creasing problems. Those problems may be further minimised by impregnating the compliant outer surface 27 with a lubricant. A dry lubricant, such as graphite, may be used.

In these embodiments, the other roller 11,13,18,21,22 at each nip 12,14,19,23,24 has a non-compliant outer surface 30. This facilitates vacuum sealing to each compliant outer surface 27 and also to the wall 4 of the treatment chamber 3, as will become more apparent hereinafter.

In these embodiments, each sealing roller 11,13,18,21,22 has a non-compliant outer surface 30. To that end, each sealing roller 11,13,18,21,22 is composed of metal for example steel which outer surface may be coated with a hard ceramic material to minimize and stabilize frictional forces between the continuous material M and these rollers 11,13,18,21,22. Each non-compliant outer surface 30 is polished, in these embodiments, in order to minimize friction and provide for low wear against rubbing seals.

To further vacuum seal the plasma treatment chamber 3, the support means 9 also includes end sealing means 31, engaging ends 32 of each roller 10,11,13,18,20,21,22 and the chamber wall 4 so as to vacuum seal therebetween, and also between adjacent rollers 10,11,13,18,20,21,22. In this way, leakage past the ends 32 is minimised. A variety of end sealing means 31 may be utilized, two embodiments of which are illustrated in FIGS. 5 and 6.

In these embodiments, the end sealing means 31 includes sealing elements 33 mounted between the roller ends 32 and chamber wall 4 so as to be in sealing engagement with surfaces 34 of the roller ends 32 and the chamber wall 4. The sealing elements 33 are mounted so as to be in rubbing, sealing engagement with the roller end surfaces 34 as those rollers 10,11,13,18,20,21,22 rotate. Those sealing elements 33 are elongate so as to extend across and/or about the roller end surfaces 34, to define uninterrupted sealing lines at each of the various zones $6,7,16_n$. The sealing elements 33 may be mounted to provide a static seal (as in FIG. 5), or a dynamic seal (as in FIG. 6).

In the embodiment as shown in FIG. 5, the sealing elements 33 are composed of resilient material and are arranged to compress engage the surfaces 34 of the roller ends 32 and the chamber wall 4. One example of such sealing elements 33 comprises molded packing 35 such as "O" or "D" or "square" or other cross sectional shaped packings mounted in grooves 37 formed in the chamber wall 4.

In the alternative embodiment as shown in FIG. 6, the sealing elements 33 are composed of rigid material resiliently biased into engagement with the roller end surfaces 34. Examples of such sealing elements 33 comprise rigid sealing blades or wings 38 resiliently biased into engagement with the roller end surfaces 34. In this embodiment, the blades or wings 38 are movably mounted in recesses 39 in the chamber wall 4 and resiliently biased out of the recesses 39 with springs 40 into engagement with the roller end surfaces 34. In this embodiment, mold packings (not shown) may be arranged to vacuum seal between the blades or wings 38 and the chamber wall 4 while permitting that movement.

In these embodiments, vacuum sealing of the plasma treatment chamber 3 is further enhanced by the inclusion of face sealing means 41 vacuum sealing between the outer surface 30 of the sealing rollers 11,13,18,21,22 and the chamber wall 4. In this way, leakage past outer the surface 30 is minimised. A variety of face sealing means may be utilised, one embodiment of which is illustrated in FIGS. 5 and 6.

The face sealing means 41 includes sealing elements 42 mounted between the outer surfaces 30 of each sealing roller 11,13,18,21,22 and the chamber wall 4. In this embodiment, the face sealing elements 42 are mounted so as to be in rubbing, sealing engagement with the roller outer surfaces 30 as those sealing rollers 11,13,18,21,22 rotate. Those sealing elements 42 are elongate, in this embodiment, and are arranged so as to extend entirely along the roller outer surface 30 and define uninterrupted sealing lines lying parallel to the axes X of rotation of the sealing rollers 11,13,18,21,22. To that end, the sealing elements 42 are of a length at least equal to the length of the sealing rollers 11,13,18,21,22. The sealing elements 42 are located diametrically opposite the nips 12,14,19,23,24 formed with the respective sealing rollers 11,13,18,21,22.

Another feature (not shown) of these elongate sealing elements 42 is that they may extend part way around the ends of the sealing rollers 11,13,18,21,22, so as to engage the end sealing elements 33. In this way, an unbroken sealing line is obtained between the orthogonally moving elongate sealing elements 42 and roller end sealing elements 33. Similar seal engagements may be arranged between the end sealing elements 33 of pairs of contacting rollers 10,11,13,18,20,21,22, thereby reducing leakage at the sealing element cross-overs.

In this embodiment, the face sealing elements 42 are composed of rigid material resiliently biased into engagement with the roller outer surfaces 30. One example of such sealing elements 42 comprises rigid sealing blades 43 biased into engagement with the outer surfaces 30. In this embodiment, the blades 43 are movably mounted in recesses 44 in the chamber wall 4, and resiliently biased out of those recesses 44, with springs 45, into engagement with the roller outer surfaces 30. In this embodiment, mold packings 46 are arranged to vacuum seal between the blades 43 and the chamber wall 4 while permitting that movement.

In the apparatus embodiment shown in FIG. 7, the backing roller 10 is sufficient to support the continuous material M as it passes through the plasma treatment stage $15_3$ and is subjected to the plasma gas G. Thus, in this embodiment, the backing roller 10 exposed to the plasma treatment stage $15_3$ carries the continuous material M on its outer surface 27 through the plasma treatment stage $15_3$. This arrangement is particularly suitable in an apparatus embodiment having only a single backing roller 10 as shown in FIG. 7.

However, in the alternative embodiment shown in FIG. 1, the support means 9 includes at least one additional backing roller 47 exposed to the plasma treatment stage $15_3$ and which supportingly carries the continuous material M through that stage $15_3$. This additional backing roller 47 is mounted within the plasma treatment stage $15_3$. Because this backing roller 47 is located within the treatment stage $15_3$, rather than at a transition zone $16_n$, there is no requirement for end or face sealing means 31,41 engaging that roller 47. The additional backing roller 47 has a compliant outer surface 27 or non-compliant outer surface 30. This arrangement is particularly suitable in an apparatus 1 (as shown in FIG. 1) having a folded path 8 through the treatment chamber 3 along which the continuous material M moves, the path 8 folding about the additional backing roller 47 in the plasma treatment stage $15_3$.

Apparatus 1 includes evacuating means 48 for establishing a vacuum in the treatment chamber 3. The evacuating means 48 includes one or more vacuum pumps 49 operatively connected to the treatment chamber 3 through vacuum lines 50. Each pump 49 will be selected according to the pumping capacity required to evacuate the plasma treatment chamber 3 to the various pressures necessary for the material treatment. Where the treatment chamber 3 is sub-divided (as shown) then a separate vacuum pump 49 is operatively connected to each sub-chamber $17_n$.

In these embodiments, the respective vacuum lines 50 of each vacuum pump 49 is connected to the treatment chamber 3 through a pumping passage 51 opening through the chamber wall 4. Each passage 51 opens through the chamber wall 4 into a respective sub-chamber $17_n$ in a sub-divided treatment chamber 3.

The apparatus 1 includes plasma generating means 52 within the treatment chamber 3 adjacent path 8. Plasma generating means 52 is operable to generate a low temperature plasma which contacts the continuous material while it is advanced through the treatment chamber 3.

In these embodiments, the plasma generating means 52 includes at least one plasma generating head 53. In the exemplary application of the apparatus 1, the head 53 is positioned to provide only one sided treatment to the passing continuous material M in order to avoid "blocking" (adhesion of the treated face to an overlying opposing face when the material M is wound into a roll). However, it will be appreciated that in alternative applications plasma treatment may occur on both surfaces of the material M, and plasma generating heads 53 will be positioned accordingly. In the exemplary application, the plasma generating means 52 comprises a single generating head 53.

In these embodiments, the plasma generating head 53 is located so as to treat an outer surface O of the continuous material as it passes around a backing roller 10,47.

Three embodiments of the plasma generating head 53 are shown in FIGS. 2-4, and in these embodiments, the plasma generating head 53 includes an array of plasma generating electrodes 54 connectable to a suitable power supply through terminals 55. These electrodes 54 are arranged in a spaced apart arcuate array so as to extend in an arc parallel with the path 8 about the outer surface 27,48 of the backing roller 10,47, respectively, in these embodiments. The arcuate extent of the electrode array is up to about 180°.

In these embodiments, each electrode 54 is elongate, and of a length at least equal to the width of continuous material M to be treated.

In these embodiments, the electrodes 54 are selected for RF or DC plasma generation. Those electrodes 54 are composed of any suitable material, such as copper or titanium. Titanium is used because of its resistance to corrosion and the inert nature of its oxidation products. The electrodes 54 may be exposed or encased in a dielectric material.

In these embodiments, the plasma generating head 53 also includes a shield member 56 arranged to concentrate the plasma at the passing continuous material m and minimize stray plasma discharge behind the electrodes 54 (away from the material M). The shield member 56 provides an arcuate shield face 57 at which the electrodes 54 are located. The shield face 57 extends parallel to the outer surface 27,48 of the backing roller 10,47, respectively, and is of a length at least equal to the length of the electrodes 54 in these embodiments.

In these embodiments, the shield member 56 includes a shield body 58 having the shield face 57. That shield body 58 is of a bulky construction, at least when used with RF plasma electrodes, to provide adequate insulation and thereby minimizing spurious and waster plasma generation. As the highly reactive and hot plasma tends to concentrate around the electrodes 54, heat resistant and inert materials are used in the construction of the shield body 58. In at least one embodiment, that shield body 58 is composed of plastic, such as PTFE or less preferably, PVC.

In one embodiment of the plasma generating head 53 as shown in FIG. 2, the shield member 56 also includes a series of glass rods 59 placed side-by-side along the shield face 57. In this embodiment, the electrodes 54 may comprise copper tube electrodes encased in thin glass tubing and placed with the glass rods 59 against the shield face 57.

In another embodiment of the plasma generating head as shown in FIG. 3, the shield member 56 includes an arcuate shaped shield plate 60 placed against the shield face 57, and over the electrodes 54 in order to cover those electrodes 54. The shield plate 60 is composed of thin glass section, in this embodiment.

These two shield member embodiments of FIGS. 2 and 3 are suitable for use in the generation of RF plasma where thin glass sections represent minimal impedance to radio frequency current flow.

In yet another embodiment of the plasma generating head as shown in FIG. 4, the shield member 55 includes an arcuate shaped shield plate 61 containing the electrodes 54 with exposed surfaces placed against the shield face 57. These electrodes 54 are exposed to the continuous material M through the shield plate 61. The shield plate 61 is composed of glass, in this embodiment.

This shield member embodiment of FIG. 4 is particularly suitable for use with titanium electrodes suitable for RF or DC plasma generation.

The plasma generating head 53 is positioned so as to prevent striations occuring in the plasma which would result in alternate bars or strips of treated and non-treated areas across the continuous material M. To that end, a minimum clearance gap 62 between the generating head 53, and in particular the electrodes 54, and continuous material m is maintained. Too large a gap 62 is also avoided as the effectiveness of plasma treatment is reduced. This distance corresponds closely to the non glow "dark space" of the head 53 when operated in isolation. Inversely proportional to pressure, the minimum distance for gap 62 is approximately 6–7 mm at about 133.32 pascal (1 Torr) pressure for a 100 watt output RF plasma discharge at 10 MHz in the plasma treatment stage.

Figure 8:
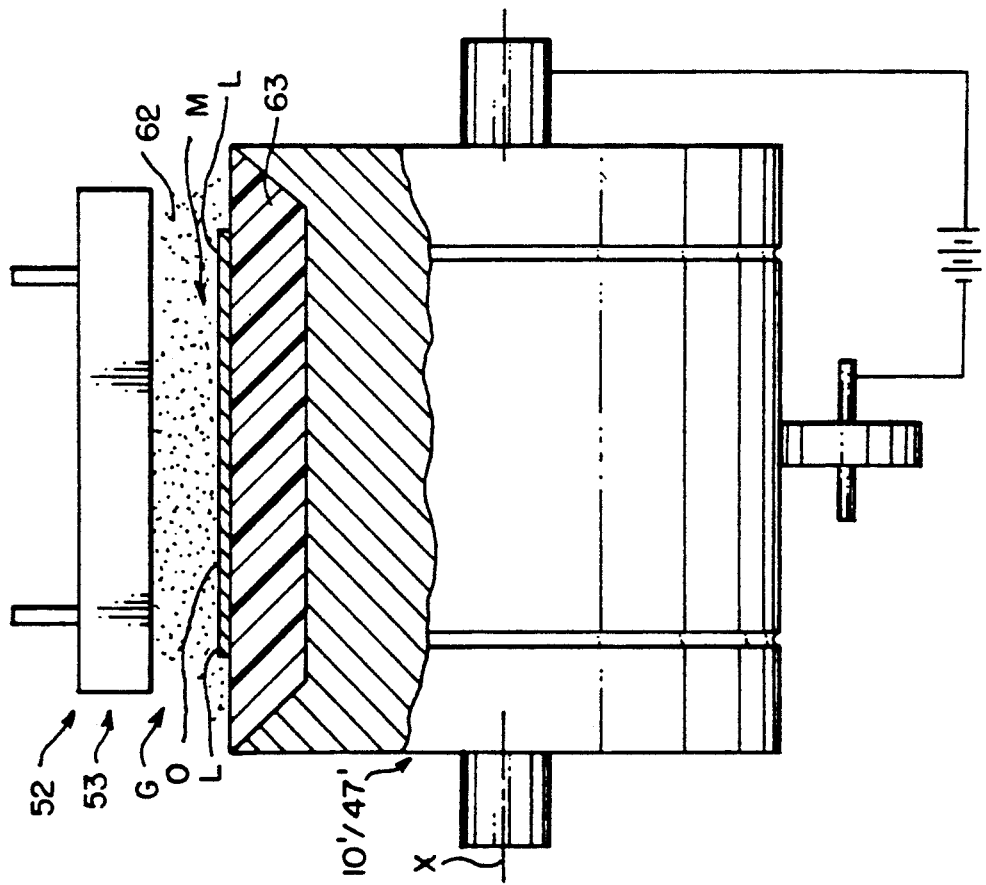
FIG. 8 is a side view, partially in cross-section of a modified backing roller that may be used in the apparatus of FIG. 1 or FIG. 7; and, FIG. 9 is a side view, partially in cross-section of a further modified backing roller that may be used in the apparatus of FIG. 1 or FIG. 7.

In a modified embodiment of the apparatus 1 (as shown in FIG. 8) part of the backing roller 10',47' comprises a conducting material which forms an electrode 63 to which an RF charge is applied thus orienting the electric field vertically relative to the continuous material M. This arrangement has been found to significantly improve treatment efficiency.

Conditions within the plasma treatment chamber 3 may be varied by introducing particular gases. Those gases may be introduced into one or more selected vacuum stages $15_n$ through passages (not shown) opening through the chamber wall 3.

In a further modified embodiment of the apparatus (again shown in FIG. 8), continuous deposition of uniform polar charge during plasma treatment is envisaged. That is achieved, in this embodiment, by applying a DC bias to electrode 63 in place of the RF charge outlined above. In this embodiment, the conducting material of the electrode 63 is partitioned by an insulating segment 64. The outer conducting part 65 of electrode 63 constitutes an earthed guard band. Additionally, in this embodiment, longitudinal edges L of the continuous material M are sealed to the backing roller outer surface 27',48'. Polar charge voltages of up to 3000 volts may be deposited on the surface of the continuous material M.

In order to further understand the present invention, the results of various tests conducted on emulsion coated photographic support, subjected to plasma treatment utilizing the apparatus 1 (constructed in accordance with the embodiment of FIG. 1) prior to coating, will now be outlined.

In initial tests, 12.7 cm wide EKTACOLOR support (polyethylene coated paper) or X-ray film support (polyethylene terephthalate) was passed through the plasma treatment apparatus 1 speeds up to 170 re/min for up to 10 minutes at a time. Pressure in the plasma treatment stage $15_3$ in discharge chamber 3 remained stable at 0.5 Torr and no material steering or creasing problems were experienced. Splices passed readily through the apparatus 1 with no discernible effect on pressure or plasma uniformity. For polyethylene coated support, a high degree of surface oxidation was achieved at maximum treatment with values as low as 0° for the receding contact angle of water on the treated surface and surface oxygen to carbon ratios as high as 16% as determined by X-ray photoelectron spectroscopy. Treatment in a DC or RF plasma gave similar results. For comparison, multiple corona discharge treatments of the same support could only achieve a minimum receding contact angle of 10°.

In subsequent tests, photographic support was treated in the apparatus 1 installed on-line with a narrow-width (12.7 cm) emulsion coating machine and the drive means of the apparatus 1 slaved to the speed of the coating machine. Single and multi layer coatings of EKTACOLOR photographic film emulsions were made onto plasma treated photographic support, comprising polyethylene coated paper, at speeds of up to 50 meters per minute. Most of the test were performed using a single layer of yellow EKTACOLOR melt containing gelatine, hardener, dispersion, silver halide emulsion and surfactants and coated with a gel laydown of 7.8 g/m² and hardener to gelatine ratio of 2% w/w.

Wet adhesion of the emulsion coatings was tested with a wire screen impression test used to monitor adhesion levels of production coatings of EKTACOLOR paper. In this test, the coating is swollen in developer solution ana a wire screen impressed onto the emulsion surface in a hydraulic press. The impressed grid pattern is then rubbed with a coarse cloth in a controlled manner and the degree of emulsion removed is noted.

On-line single coatings showed no emulsion removal upon testing 24 hours after coating, provided the plasma current during treatment exceeded 20 milliamps at 50 meters per minute support speed.

By way of comparison, identical emulsion coatings made off-line on photographic support treated 30 minutes or longer prior to coating required 1 to 2 weeks storage at 70° F. and 65% RH to reach the same level of adhesion. In these off-line cases, plasma currents of about 200 milliamps were required for optimum adhesion. Support surfaces treated off-line with currents as low as 20 milliamps failed to reach a satisfactory level of emulsion coating adhesion several months after coating.

Identical emulsion coatings on support treated off-line by a corona discharge (optimised for maximum adhesion) showed a similar adhesion behaviour as off-line plasma treatment, requiring one to two weeks storage to reach a satisfactory level of emulsion adhesion. The energy applied per unit area of photographic support in the corona treatment was approximately 30 times that required for the on-line plasma treatment.

A full EKTACOLOR pack (six coated layers) was also coated on-line after plasma treatment using hardener to gel ratios of 1 and 2%, with the apparatus of the present invention. Satisfactory emulsion adhesion was achieved 24 hours after coating for the 1% case and at 24 hours after coating for the 2% case.

By way of comparison, a similar emulsion coating at 1.3% hardener level carried out using a production coating machine with on-line corona discharge required more than six weeks to reach the same level of adhesion.

The decay of the surface treatment after plasma treatment with the apparatus 1 was determined by successively increasing the time delay between treatment and emulsion coating and carrying out subsequent 24 hour wire screen tests. The minimum plasma current required to give satisfactory adhesion increased from 20 milliamps at a 3 second delay to 40 milliamps at a delay of 800 seconds. The decay half-life of the surface treatment was therefore about 800 seconds and emulsion coatings should be carried out within about 400 seconds of treatment for maximum emulsion adhesion in the exemplary application.

In other tests, a sample of 12.7 cm wide EKTACOLOR support was passed through a corona discharge unit and found to display non-uniform polar charge at levels up to +200 V. The pattern of surface charge could be readily observed by sprinkling electrostatic toner over the surface. This support was then passed through the apparatus 1 providing an RF plasma in air at 1 Torr pressure at a speed of 50 re/min using a plasma current of 100 mA. After this treatment the polar charge was reduced to a residual uniform level of 1 to 2 V. A similar uniform charge of 1 to 2 V was also observed when untreated support was passed through the apparatus 1.

The wet adhesion of photographic emulsions to plasma treated polyethylene generally improves with time over a period of weeks or months after coating. For this type of pre-treatment, it is believed that the bonding mechanism involves the limited number of primary amino groups on the gelatine molecules present in the emulsions. The gelatine molecules slowly change orientation after coating, coming into contact with stable reaction sites on the polyethylene surface. However, if the emulsions are coated on freshly plasma treated polyethylene, a quite different adhesion mechanism appears to occur. Good adhesion is found as soon as the coating emulsions have hardened sufficiently to allow tests to be carried out normally 24 hours after coating. The energy input required per unit area is about 30 times less than that required for optimum corona treatment and about 10 times less than that required for optimum adhesion to aged plasma treated support. Furthermore, the adhesion to freshly plasma treated support does not significantly improve with subsequent storage after coating, at the minimum treatment levels. A new and potent adhesion mechanism is indicated.

The apparatus of the present invention increases the rate of improvement compared with previous arrangements in the adhesion of photographic emulsion coatings to photographic support. This in turn enables inventory holding times of the support to be reduced.

The apparent different gelatin to polyethylene adhesion mechanism, separates adhesion from cohesion, both of which it is believed, formerly relied on the same primary amino sites, in the gelatin molecules. Thus there was competition between the two processes. Therefore, the apparatus also increases tolerance to increased levels of gelatine hardener in EKTACOLOR paper as a result of plasma treatment of the support. That increase is possible without an increase in support inventory holding time. An increase in gelatine hardener provides associated improvements in product quality, such as reduced reticulation tendency, improved abrasion resistance and less susceptability to fingerprinting.

The apparatus simplifies photographic support manufacturing operations compared with current arrangements.

In a preferred arrangement, the apparatus is also useful for charge deposition to aid high speed coating of a variety of products.

A variety of applications other than plasma treatment of photographic support are envisaged for the apparatus. Many of the existing effects and applications of plasma treatment previously described may be brought to commercial realization through use of the apparatus of this application. For example since the wettability of wool is greatly increased by plasma treatment, the apparatus may be useful in modifying the properties of woven woollen fabrics to allow screen printing to be carried out. Virtually all existing applications of corona discharge treatment of continuous material could be placed by the present plasma treatment apparatus, providing it is cost effective to do so.

The introduction of different gases or polymerizable monomers into the plasma treatment chamber may allow selective modification of surface properties and the production of thin films on the continuous material. The latter have potential for development into a variety of single or multi layered products such as subbing layers, antireflection films for solar control filters and protective overcoats.

Opportunities arise for improved adhesion in the printing industry with on-line treatment and printing and for improving the self adhesion or adhesive bonding of laminates, through use of the apparatus of the present invention.

The apparatus of the present invention may be suitable for combining several continuous materials by allowing even the very unstable hydrocarbon radicals to form bonds across adjacent surfaces. To that extent the apparatus may be utilized in cardboard or paper composite manufacture.

It is to be appreciated that modifications and/or additions may be made to the apparatus without departing from the ambit of the present invention as defined in the claims appended hereto.

What is claimed is:

1. An apparatus (1) for continuous treatment of a material (M) of continuous length with a low temperature plasma of a plasma gas under vacuum, the apparatus (1) comprising: a plasma treatment chamber (3) having a chamber wall (4) and, in the wall (4), an entrance zone (6) and an exit zone (7) for receiving and discharging the continuous material (M), respectively, and the treatment chamber (3) having at least one transition zone (16) spaced from the entrance and exit zones (6,7) and dividing the treatment chamber (3) into sub-chambers (17); evacuating means (49) operable to establish a vacuum in the sub-chambers (17); support means (9) for advancing the continuous material (}M) along a path (8) through the sub-chambers (17) and also for maintaining a vacuum seal at the entrance and exit zones (6,7) and each transition zone (16) while the continuous material (M) passes therethrough; and plasma generating means (52) positioned within the treatment chamber (3) adjacent the path (8) for generating a low temperature plasma which contacts the continuous material (M) while it is advanced through the treatment chamber (3); characterized in that the support means (9) includes a backing roller (10) mounted adjacent the entrance and exit zones (6,7) for rotation on an axis (X) thereof, an entrance sealing roller (11) positioned adjacent the entrance zone (6), an exit sealing roller (13) positioned adjacent the exit zone (7) and a transition sealing roller (18) positioned at each transition zone (16), each sealing roller (11, 13, 18) being mounted for rotation on a respective axis thereof; the backing roller (10) forming with each sealing roller (11, 13, 18) a respective nip (12, 14, 19) at the entrance zone (6), exit zone (7) and each transition zone (16) through which the continuous material (M) passes into and out of the treatment chamber (3) and during advancement between adjacent sub-chambers (17), respectively.

2. Apparatus as claimed in claim 1, wherein the treatment chamber (3) is sub-divided into a series of sub-chambers (17) providing sequential vacuum stages (15) between the entrance and exit zones (6,7), the vacuum varying between adjacent stages (15), and the plasma generating means (52) is positioned within one of the sub-chambers (17$_3$) providing a plasma treatment vacuum stage (15$_3$).

3. Apparatus as claimed in claim 2, wherein the vacuum stages (15) comprise at least one pre-treatment vacuum stage (15$_1$, 15$_2$) between the entrance zone (6) and the plasma treatment vacuum stage (15$_3$) and at least one post-treatment vacuum stage (15$_4$, 15$_5$) between the plasma treatment vacuum stage (15$_3$) and the exit zone (7).

4. Apparatus as claimed in claim 3, wherein each vacuum stage (15) is provided by a separate sub-camber (17) and through which the path (8) makes a single pass between the entrance and exit zones (6,7).

5. Apparatus as claimed in claim 1, wherein each roller (10, 11, 13, 18) is of a length at least equal to the width of continuous material (M) being treated.

6. Apparatus as claimed in claim 1, wherein that drive means is connected to a least one of the rollers (10, 11, 13, 18) for driving rotation thereof.

7. Apparatus as claimed in claim 1, wherein at least one roller (10) at each nip (12, 14, 19) has a compliant outer circumferential surface (27) in order to improve sealing between the rollers (10, 11, 13, 18) and continuous material (M).

8. Apparatus as claimed in claim 7, wherein the backing roller (10) has a complaint outer circumferential surface (27), the backing roller (10) comprising a core (28) of non-compliant material, and an outer sleeve (29) composed of compliant material providing the compliant surface (27).

9. Apparatus as claimed in claim 7, wherein at least one roller (10) at each nip (12, 14, 19) has a compliant surface (27) and the other roller (11, 13, 18) at each nip (12, 14 19) has a non-complaint surface (30).

10. Apparatus as claimed in claim 9, wherein each compliant and non-compliant surface (27, 30) is polished to reduce grip on the continuous material (M).

11. Apparatus as claimed in claim 1, wherein the support means (9) further comprises end sealing means (31) engaging ends (32) of each roller (10, 11, 13, 18) and the chamber wall (4) so as to vacuum seal therebetween and also between adjacent rollers (10, 11, 13, 18).

12. Apparatus as claimed in claim 11, wherein the end sealing means (31) comprises elongate end sealing elements (33) mounted between the roller ends (32) and chamber wall (4), and define uninterrupted sealing lines at the roller ends (32) at each of the zones (6,7,16).

13. Apparatus as claimed in claim 1, wherein the face sealing means (41) is provided for vacuum sealing between the outer circumferential surface (30) of the sealing rollers (11, 13, 18) and the chamber wall (4).

14. Apparatus as claimed in claim 13, wherein the face sealing means (41) includes elongate face sealing elements (42) mounted between the outer surface (30) of each sealing roller (11, 13, 18) and the chamber wall (4), the sealing elements (42) being arranged to extend entirely along the outer circumferential surface (30) of the sealing rollers (11, 13, 18) so as to be in sealing engagement with the outer surfaces (30) and chamber wall (4), and define uninterrupted sealing lines along the sealing rollers (11,13, 18).

15. Apparatus as claimed in claim 14, wherein the face sealing elements (42) extend part way around the ends (32) of the sealing rollers (11, 13, 18) so as to engage the end sealing elements (33) and seal therewith.

16. Apparatus as claimed in claim 1, wherein plasma generating means (52) includes at least one plasma generating head (53) located so as to treat an outer surface (O) of the continuous material (M).

17. Apparatus as claimed in claim 16, wherein the continuous material (M) passes about the backing roller (10) adjacent the entrance and exit zones (6,7) during advancement along the path (P) through the plasma treatment chamber (3), and the plasma generating head (53) is located adjacent and outwardly of the backing roller (10) and operable to treat the continuous material outer surface (O) as the continuous material (M) passes about the backing roller (10).

18. An apparatus as claimed in claim 17, wherein the backing roller (10) includes an electrode (63) to which an RF change is applied for orienting the electric field relative to the continuous material (M).

19. Apparatus as claimed in claim 17, wherein the backing roller (10) includes an electrode (63) to which a DC bias is applied so as to deposit a uniform polar charge on a surface of the continuous material (M) during plasma treatment.

20. Apparatus as claimed in claim 19, wherein the backing roller (10) has a conductive part (65) at the outer surface (27') thereof, electrically insulated from the plasma by the continuous material (M), and electrical contact is made with the conductive part (65) in isolation from the plasma.

21. Apparatus as claimed in claim 16, wherein the plasma generating head (53) includes an array of plasma generating electrodes (54) arranged in a spaced part arcuate array so as to extend in an arc parallel with the path (P) about the outer circumferential surface (27) of the backing roller (10) at which the continuous material (M) is treated.

22. Apparatus as claimed in claim 21, wherein each electrode (54) is elongate and of a length at least equal to the width of the continuous material (M) to be treated.

23. Apparatus as claimed in claim 21, wherein the plasma generating head (54) also includes a shield member (56) for concentrating the plasma toward the path (P) of the continuous material (M) and minimizing stray plasma discharge away from the path (P).

24. Apparatus as claimed in claim 23, wherein the shield member (56) includes an arcuate shield face (57) extending parallel with and facing toward the path (P) about the outer circumferential surface (27) of the backing roller (10) at which the continuous material (M) is treated, the electrodes (54) being located about the shield face (57).

25. Apparatus as claimed in claim 24, wherein the shield member (56) also includes a series of glass rods (59) placed side-by-side along the shield face (57), and the electrodes (54) are encased in glass tubing and placed with the glass rods (59) against the shield face (57).

26. Apparatus as claimed in claim 24, wherein the shield member (56) also includes an arcuate shaped glass shield plate (60) placed over the shield face (57), the electrodes (54) being placed against the shield face (57) beneath the shield plate (60).

27. Apparatus as claimed in claim 24, wherein the shield member (56) also includes an arcuate shaped glass shield plate (60) placed against the shield face (57), the electrode (54) being embedded in the shield plate (60) and exposed to the path (P) of the continuous material (M).

* * * * *